United States Patent [19]

Rogers

[11] 4,278,930
[45] Jul. 14, 1981

[54] CURRENT SENSING CIRCUIT FOR POWER SUPPLY WITH SERIES CONTROL TRANSISTOR

[75] Inventor: Robert G. Rogers, Los Altos, Calif.

[73] Assignee: GTE Automatic Electric Laboratories, Inc., Northlake, Ill.

[21] Appl. No.: 79,650

[22] Filed: Sep. 27, 1979

[51] Int. Cl.³ .................................................. G05F 1/58
[52] U.S. Cl. ...................................... 323/285; 323/277; 361/93
[58] Field of Search .............. 323/9, 17, 20, 40, 75 N, 323/DIG. 1; 361/93, 100; 363/56

[56] References Cited

U.S. PATENT DOCUMENTS

| | | |
|---|---|---|
| 3,585,491 | 6/1971 | Peterson .................................. 323/9 |
| 3,839,668 | 10/1974 | Black ............................. 323/DIG. 1 |
| 3,986,100 | 10/1976 | Beierholm et al. ..................... 323/20 |

FOREIGN PATENT DOCUMENTS 1439454  6/1976  United Kingdom .............. 323/DIG. 1

OTHER PUBLICATIONS

Richardson, "Comparator Switches Regulator for Foldback Current Limiting", Electronics, Mar. 3, 1977, pp. 105, 107.

Gregorcic, "Transistorized D.C. Voltage Regulator as a Common Source of Reference Voltage", Elektrotehniski Vestnik, vol. 43, No. 1, pp. 40-45, Jan.-Feb. 1976, S61040342D.

Primary Examiner—A. D. Pellinen
Attorney, Agent, or Firm—Russell A. Cannon

[57] ABSTRACT

A −DC to +DC voltage converter having one input and one output terminal connected to ground and regulator circuitry responsive to a control voltage for regulating the magnitude of output current delivered to a load impedance connected across the output terminals. Apparatus producing the control voltage comprises a passive resistive bridge circuit having one pair of nodes connected between the other input and other output terminals and a current sensing resistor in one arm of the bridge so as to pass load current to the other output terminal, a difference voltage that is the control voltage being developed between the second pair of nodes of the bridge. In one embodiment, the bridge comprises a potentiometer having a moveable contact connected to the other input terminal, and first and second pairs of series connected resistors connected between opposite sides of the potentiometer and opposite sides of the current sensing resistor. The potentiometer is adjusted to make the difference voltage between junctions of resistors of the pairs thereof a desired value for a prescribed maximum load current in the current sensing resistor. In an alternate embodiment that is also responsive to input current, the potentiometer is replaced by fixed resistor connected to the other input terminal and having opposite sides thereof connected to ends of associated series connected resistors, one of the other resistors being variable for adjusting the bridge.

6 Claims, 4 Drawing Figures

CURRENT SENSING CIRCUIT FOR POWER SUPPLY WITH SERIES CONTROL TRANSISTOR

BACKGROUND OF INVENTION

This invention relates to control circuitry for electrical circuits, and more particularly to improved circuitry in a power supply for sensing the load current provided thereby and limiting the maximum value thereof.

Regulated power supplies are employed to convert an input line voltage to a relatively constant supply voltage of a different value for driving an external load. A prior art DC-to-DC switching converter is described in Universal Switching Regulator Subsystem, Fairchild $\mu$A78S40, Preliminary Data Sheet, December 1977. Switching converters are also described in Switching Regulator Operation, Fairchild Progress, Journal of Semiconductor, pgs. 19-24, vol. 7 #2 March/April 1979. Prior Art AC-to-DC voltage converter type power supplies are illustrated in FIGS. 12 and 13 of Hewlett Packard Application Note #90A, DC Power Supply Handbook, copyright 1970.

Current limiting is important in any form of regulator and converter in order to prevent the series connected active element thereof dissipating excessive power under short circuit overload conditions. In an elementary prior-art circuit for sensing load current in a switched converter, the base-emitter junction of a control transistor is connected across a series current monitoring resistor, the collector of the control transistor being connected to the base of a switching transistor. When the voltage across the monitor resistor is approximately 0.7 volt for a prescribed load current, the control transistor conducts to turn off the switching transistor. In most instances, this means that the resistance of the monitor resistor must be small and a precise value for turning off the switching transistor for a prescribed load current. By way of example, the resistance of the monitor resistor is only 0.35 ohm for a load current of 2.0 amperes. This means that the monitor resistor must be a precision value factory select resistor, increasing the cost of and time to produce such a switching converter. In the constant current power supplies in FIGS. 12 and 13 of the Hewlett Packard handbook, supra, the feedback loop associated with a series current monitor resistor comprises a Zener diode that is connected across a reference voltage regulator circuit, one side of the diode being directly electrically connected to one side of the monitor resistor and to one input of a differential amplifier. The other side of the Zener is electrically connected through a fixed resistor and a variable resistor that are connected in series to the other side of the monitor resistor, the junction of the series connected resistors being connected to the other input of the differential amplifier that produces an output control voltage that is applied to the base of a series regulator transistor. This prior art current feedback loop requires a reference power supply, an additional complication that reduces efficiency, and a Zener diode to produce the voltage reference. This means that the voltage reference is temperature sensitive, as is the current control. In addition, the Zener's temperature characteristics cannot be readily matched to temperature characteristics of resistors there in order to make current control independent of operating temperature.

Further, one side of the input to the constant current comparison amplifier is connected to the output circuit. This means that the amplifier itself must have a separate power supply, since connecting this input and the amplifiers' positive bias supply terminal to the same line is impractical. An object of this invention is the provision of an improved current sensing circuit for a power supply.

SUMMARY OF THE INVENTION

In accordance with this invention, a power supply responsive to an input voltage at a pair of input terminals for producing an output voltage at a pair of output terminals across which a load impedance is connected includes apparatus for producing an indication of the load current passed by a first output terminal comprising passive resistive bridge circuit means having a first pair of nodes electrically connected between the first output terminal and an other one of the terminals, the resistive bridge circuit means including in one of the arms thereof a current sensing resistor that is electrically connected to the first output terminal and passes load current therethrough, a difference voltage being developed between the second pair of nodes of the bridge circuit means that are spaced from the terminals and being an indication of load current passed thereby.

BRIEF DESCRIPTION OF DRAWINGS

This invention will be more fully understood from the following detailed descriptions of preferred embodiments thereof wherein.

DESCRIPTION OF PREFERRED EMBODIMENTS

Figure 1:
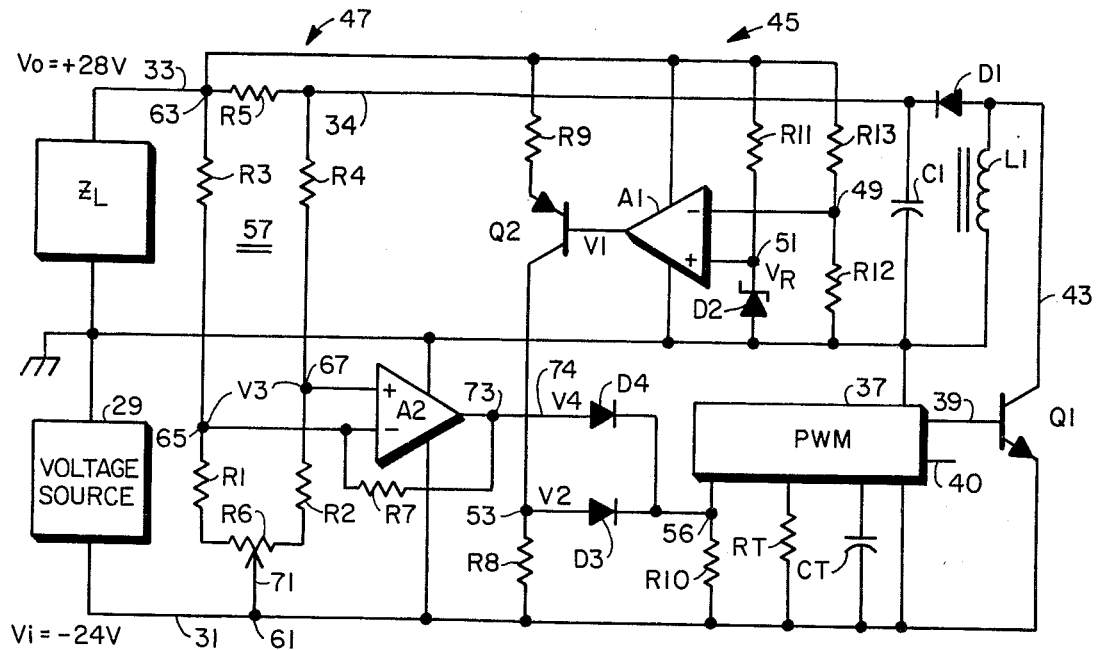
FIG. 1 is a schematic circuit diagram of a DC-to-DC voltage converter embodying this invention.

The voltage converter of FIG. 1 is operative for converting a $-24$ volt signal voltage from source 29, that is developed between input line 31 and ground, to a regulated $+28$ volt output signal voltage between line 33 and ground. The voltage converter in FIG. 1 comprises a switching transistor Q1 having its base driven by pulses from a pulse width modulator 37 and its primary conduction path electrically connected between the input line 31 and ground through an inductor L1 and the series combination of a commutating diode D1 and storage capacitor C1; an output voltage monitor circuit 45; and a load current monitor circuit 47. When the pulse voltage on line 39 is positive, Q1 conducts current through L1 for inducing an electromagnetic field in it, and through D1 for charging C1 for producing an output voltage for driving a load impedance $Z_L$. When the drive voltage on line 39 is zero, Q1 is cut off to cause the field on L1 to decay to pass a current through commutating diode D1 that charges C1 to maintain a substantially constant voltage on it.

The voltage monitor circuit 45 comprises a differential input operational amplifier A1; voltage divider resistors R12 and R13 producing a voltage at node 49 that is a fixed percentage of the output voltage Vo on line 33 of the comparator; and a resistor R11 and Zener diode D2 producing a fixed reference voltage $V_R$ at node 51. The output voltage of A1 is a DC control voltage V1 that is referenced to ground and is proportional to the difference between the output voltage Vo and the reference voltage $V_R$. The voltage V1 is translated to a control voltage V2 that is referenced to the −24 volt bus 31 by resistors R8 and R9 and a transistor Q2 having its base connected to the output of A1. The constant current characteristics of Q2 cause its collector current and hence the voltage V2 across R8 to be inversely proportional to V1. Assuming D4 is an open circuit, D3 conducts to couple the voltage V2 to node 56 for controlling the operation of the modulator and thus the width of pulses on line 39.

The modulator 37 may, by way of example, be a Motorola MC3420 silicon monolithic integrated circuit. An external timing resistor $R_T$ and timing capacitor $C_T$ are connected to the modulator for establishing the operating frequency thereof which is normally between 2 kHz and 100 kHz, values of $R_T$ and $C_T$ being specified in manufacturer's data sheets. The modulator produces trains of pulses on lines 39 and 40 thereof that are 180° out-of-phase, pulses on line 39 being connected to the Q1 base. The pulse frequency is selected for the most efficient operating frequency of L1 and may be 7 kHz. The modulator is responsive to the control voltage at node 56 for varying the width of voltage pulses on line 39. In order to decrease the collector current in Q1 and improve the efficiency of the converter, pulse signals on lines 39 and 40 may be connected to base electrodes of associated transistors (not shown) having their collectors electrically connected to line 43. Each of these transistors then operates at half the pulse frequency or 3.5 kHz. The voltage on L1, however, still switches at the 7 kHz rate.

In a voltage converter of FIG. 1 that was built and operated, the output voltage on line 33 was a value causing V2 to be approximately +6 volts with respect to the −24 volt input on line 31 under no load conditions (i.e., $Z_L$ is very large) for causing modulator 37 to produce pulses having a very short duration which is sufficient to compensate for circuit losses. When the load impedance was a rated value for which the converter was designed to operate, the feedback circuit 45 causes V2 to decrease to approximately +2 volts with respect to line 31. This voltage V2 causes the modulator to produce pulses on line 39 having a 50% duty cycle, the point of operation at which maximum energy transfer occurs while maintaining the output voltage substantially constant. Under heavy load conditions, the output voltage tends to decrease. This voltage change is reflected to node 49 for increasing V1. This causes a corresponding decrease in the voltage V2 at node 53 that is applied to node 56 for causing the modulator to increase the width of pulses on line 39 for increasing the conduction time of Q1. This causes the converter to produce a larger switching energy in an attempt to maintain the output voltage thereof substantially constant. Load current will continue to increase under overload conditions unless the converter includes circuitry for limiting the maximum value thereof.

The current monitor circuit 47 comprises a series current sensing resistor R5 in an arm of a passive resistive bridge circuit 57, and a differential input operational amplifier A2. One pair of nodes 61 and 63 of the bridge 57 are connected to input and output lines 31 and 33. The other pair of nodes 65 and 67 of the bridge are connected to input terminals of A2. The supply voltage terminals of A2 are connected between the −24 volt input bus and ground so that the supply voltage on A2 remains fixed as the output voltage between line 33 and ground decreases. The bridge 57 comprises first and second voltage dividers including resistors R1 and R3 and resistors R2 and R4, respectively, and having tap points which are the nodes 65 and 67; the resistor R5; and a potentiometer R6 having a moveable contact 71 connected to input line 31 at the node 61. One ends of the voltage dividers are connected to opposite sides of the current monitor resistor R5. The other ends of the voltage dividers are connected to opposite sides of R6. The current sensing resistor R5 is connected in series with R4 in one of the arms of the bridge and is responsive to a load current $I_L$ in line 34 for operating as a voltage source producing an offset voltage that is proportional to this load current $I_L$. The resistors R1-R4 are selected so that the resistances thereof all drift in the same direction with change in temperature. This makes it possible to readily predict the temperature response of this passive resistive bridge type circuit. The temperature characteristics of R5 and R6 have been found to have little effect on the temperature response of the bridge.

The amplifier A2 is responsive to the unbalance voltage V3 on the bridge for producing a control voltage V4 at node 73. When V4 is more positive than V2 by at least 0.7 volt, then D3 is cut off and D4 conducts to selectively couple the voltage V4 to node 56 for controlling the operation of the modulator for limiting the maximum load current provided by the converter, as is described more fully hereinafter. Conversely, when V2 is more positive than V4 by at least 0.7 volt, then D3 conducts and D4 is cut off so that the current monitor circuit 47 has no control over the operation of the modulator.

The difference voltage V3 on bridge 57 is representable as $$V3 = (Vo + Vi)\left(\frac{R1 + kR6}{R1 + R3 + kR6}\right) - \quad (1)$$

$$(Vo + Vi)\left(\frac{R2 + (1-k)R6}{R2 + R4 + (1-k)R6}\right) -$$

$$(\pm R5I_L)\left(\frac{R2 + (1-k)R6}{R2 + R4 + (1-k)R6}\right)$$

where k represents the fraction of R6 that is in series with R1, (1−k) represents the fractional remainder of R6 that is in series with R2, and the sense symbol ± indicates that the sign of the third term here is a function of the direction of load current $I_L$ in R5. The first two terms in equation (1) are those of the conventional Wheatstone bridge. The third term there is a DC offset voltage set by the load current in R5. This is apparent when it is noted that the bridge 57 is balanced, i.e., V3=0, when $$R1=R2, R3=R4, k=\tfrac{1}{2}, \text{ and } R5=0. \quad (2)$$

When these conditions are satisfied except for R5 being other than zero valued, however, the difference voltage V3 is $$V3 = (\pm R5I_L)\left(\frac{R1 + R6/2}{R1 + R3 + R6/2}\right) \quad (3)$$

This means that the voltage drop $R5I_L$ across the current sensing resistor, reduced in magnitude by resistors of the bridge circuit, is the output of bridge 57 under these conditions. This voltage divider stepdown action is needed to translate the voltage drop on R5 from the output circuit to the −24 volt bus 31 that is connected to A2 and the modulator. The gain of A2 is adjusted to compensate for this small voltage drop.

Reference to equation (3) also reveals that V3 is a function of the resistances of the fixed resistors in the voltage dividers, the position of the contact 71 on potentiometer R6, and the resistance of R7 which sets the gain of A2, as well as load current in R5. In accordance with this invention, the potentiometer R6 is adjusted to change the value of k and deliberately unbalance the bridge in order to obtain a desired value of V3 defined by equation (1) and set the load current limit point of the circuit. Thus, the current limit point for the converter is set independently of the actual value of R5, which is no longer critical. The resistor R5 here may be a commercially available stock resistor of the type normally used in factory production with up to 5% tolerance and a small value of resistance. The position of the contact 71 on R6 is adjusted to vary k and compensate for variations in the resistances of R1–R5 and cause V3 to be the desired value.

Consideration of equation (1) also reveals that V3 is made up of fixed fractions of (Vo+Vi) and $R5I_L$. This means that as load impedance decreases below the value for which R6 is set to give a maximum load current at a fixed load voltage, the current control circuit 47 senses changes in both $R5I_L$ and (Vo+Vi). Since the first two terms in equation (1) are in part derived from load voltage, which is dropping with decreased load impedance, the combined effect of changes in the three terms in equation (1) is to keep load current control from being a constant current phenomenon: i.e., load current drops somewhat along with load voltage. This means that when power delivered to the load decreases under such overload conditions there is less heat dissipated in the converter than if a constant current control condition existed in this instance. This converter is therefore able to sustain an overload for an extended time period.

In a −24 volt to +28 volt DC-to-DC converter in FIG. 1 that was built and successfully operated, the resistances of the bridge resistors in the current monitor circuit 47 were: R1=R2=12.1 kohms, R3=R4=38.3 kohms; R5=0.25 ohm; and R6=500 ohms. All of the resistors R1–R5 were 5% tolerance commercially available resistors that are normally used in manufacturing operations. The resistances of R1–R4 were selected for bridge balanced conditions expressed in equation (2) and to bias the input of A2 at −12 volts, which is approximately halfway between ground and the −24 volt line 31. This means that approximately one quarter of the voltage drop on R5 appears as the difference voltage V3 at the input to A2. The value of k of R6 is chosen to give the required current control and to compensate for variations in bridge resistors. These resistances allow a current of 1 milliampere to pass through each bridge arm for a peak load current of approximately 1.5 amperes.

Considering the overall operation of the voltage converter in FIG. 1, the value of k for R6 and gain of A2 are adjusted to provide a voltage V4 at node 73 that is at least 0.7 volt greater than the control voltage V2 established by the voltage monitor circuit 45 for a load current in R5 that is a maximum allowable value thereof. Under normal operation where the load current is less than the maximum allowable value, D4 is cut off and D3 conducts to maintain the control voltage at node 56 between values such as +2 volts and +6 volts with respect to input line 31 so that the output voltage is approximately +28 volts. As the output voltage decreases under overload conditions, the voltage monitor circuit 45 causes V2 to decrease for increasing the width of pulses on line 39 and the conduction time of Q1 for increasing the load current in an attempt to maintain the output voltage substantially constant. This causes a corresponding increase in V3. When the overload condition causes load current to increase to the maximum allowable value, however, the difference voltage V3 is sufficient to make V4 at least 0.7 volt more positive than V2 so that D4 conducts and D3 is cut off for clamping the voltage at node 56 to approximately V4 for limiting the maximum width of voltage pulses produced on line 39 by the modulator and, thus, the peak load current from the converter. The diode D3 remains cut off until load current falls below the prescribed maximum value thereof.

Figure 2:
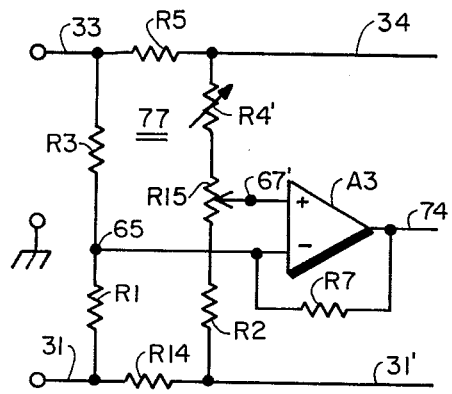
FIGS. 2 and 3 are schematic circuit diagrams of alternate embodiments of this invention.
Figure 3:
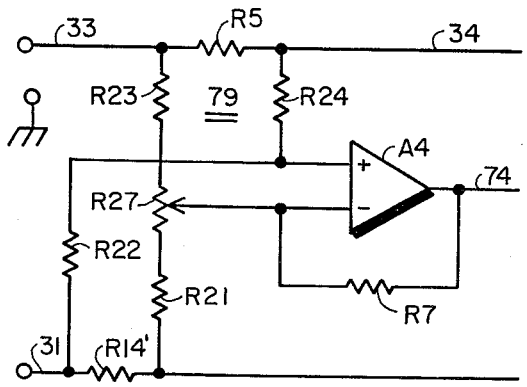
Figure 4:
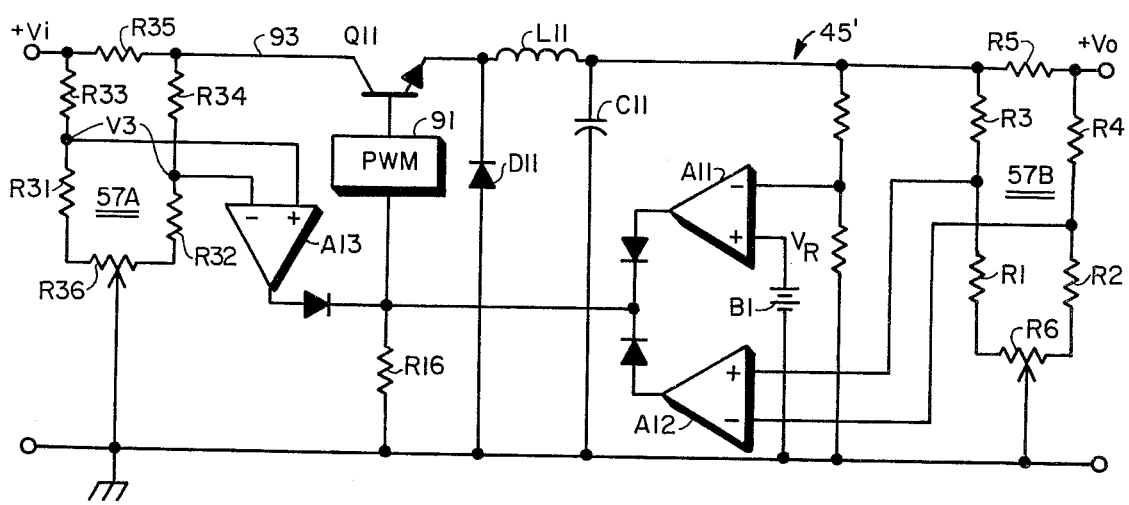
FIG. 4 is a schematic circuit diagram of a voltage stepdown type DC-to-DC converter embodying this invention, external timing elements and connections of the modulator 91 to input voltage line 93 and ground being omitted for convenience of illustration.

Although this invention is described in relation to a preferred embodiment thereof, variations and modifications will be apparent to those skilled in the art. By way of example, the potentiometer R6 may be replaced by a short circuit connecting R1 and R2 to the −24 volt input line 31 and replacing any one or more of the resistors R1–R4 with a variable resistor that is adjusted for setting the bridge. And in an alternate embodiment of this invention, the potentiometer R6 is replaced with a small series resistor R14 in input line 31 (see FIG. 2). The difference voltage across input terminals of A3 in bridge 77 is proportional to the sum of the input line current in R14 and the output load current in R5. The bridge 77 is adjusted to compensate for variations in resistors thereof by changing the position of the contact on a potentiometer R15. The bridge 77 senses an increase in load current in R5 above a prescribed maximum value and excessive line current in R14 for protecting the converter. In another configuration, the lower ends of the two voltage dividers in FIG. 2 are connected to opposite sides of a resistor R14′ in bridge 79 (see FIG. 3). The voltage across input terminals to A4 is then proportional to the difference between the voltages on the current sensing resistors R5 and R14′. The resistors R5, R14′, and R21–R24 may be selected and R27 adjusted to make the voltage drops across R5 and R14 cancel for prescribed values of load current and line current. This bridge 79 is particularly useful in a voltage regulator for preventing hard shutdown, but does not perform the load-limiting function of the circuit 47 in FIG. 1. A second current control circuit like the circuit 47 is needed to perform that function. Further, separate bridge type current monitor circuits 57A and 57B may be employed for monitoring line current and load current as is illustrated in the voltage stepdown type DC-to-DC converter in FIG. 4. This converter comprises a series switching transistor Q11 that is driven by pulses from pulse width modulator 91, commutating diode D11, inductor L11, capacitor C11, and voltage monitor circuit 45′. The current sensing resistors R5 and R35 are connected in series with the primary conduction path of Q11 in the output and input lines, respectively. The difference amplifiers of the current monitor circuits 57A and 57B and voltage monitor circuit 45′ are connected through associated steering diodes to a summing resistor R16 and the modulator 91 for selectively controlling the duty cycle of the latter. Also, a current monitor control circuit embodying this invention is applicable to conventional non-switching type voltage regulators, AC-to-DC voltage converters, and other types of DC-to-DC converters including step-up and +DC to −DC converters. The scope of this invention is therefore to be determined from the appended claims, rather than from the aforementioned detailed descriptions of preferred embodiments thereof.

What is claimed is:

1. In a voltage converter responsive to an input voltage at a pair of input terminals for producing an output voltage at a pair of output terminals across which a load impedance is to be connected, apparatus for producing an indication of load current outputted from a first output terminal comprising:

passive resistive bridge circuit means having a pair of nodes electrically connected between the first output terminal and an other one of the terminals, said resistive bridge circuit means comprising:

a first resistor in one of the arms of said bridge means that is adjacent the first output terminal, said first resistor being a current sensing resistor that passes the load current therethrough to said first output terminal;

a potentiometer having one and other sides thereof and having a moveable contact electrically connected to said other one of the terminals;

a first resistive voltage divider means including second and third series connected resistors having one ends thereof electrically connected together at a first tap point and having other ends electrically connected to the one side of said potentiometer and to one side of said first resistor that is connected to said first terminal, respectively;

a second resistive voltage divider means including fourth and fifth series connected resistors having one ends electrically connected together at a second tap point and having other ends electrically connected to the other side of said potentiometer and to the other side of said first resistor, respectively;

the resistance of said potentiometer being varied for adjusting the magnitude of difference voltage developed between said voltage divider tap points, which difference voltage is an indication of the load current passed by the voltage converter, to be a prescribed value for a given load current in said first resistor.

2. Apparatus according to claim 1 wherein the other one of the terminals is an input terminal, and wherein the other input and other output terminals are electrically connected together.

3. Apparatus according to claim 2 wherein the resistances of said second and fourth resistors are substantially the same values, and wherein the resistances of said third and fifth resistors are substantially the same values.

4. In a voltage converter responsive to an input voltage at first and second input terminals for producing an output voltage at first and second output terminals across which a load impedance is to be connected and including switching transistor means having one and other sides of a primary conduction path therethrough with the one side thereof electrically connected to the first input terminal, and first means electrically connecting the other side of the transistor means to the second input and second output terminals which are common, the first means being responsive to the primary conduction current for producing the output voltage and a load current on an output line thereof that is electrically connected to the first output terminal, apparatus for producing an indication of load current outputted from the first output terminal comprising:

passive resistive bridge circuit means having a first pair of nodes electrically connected between the first input and first output terminals, said resistive bridge circuit means comprising:

a first current sensing resistor in series in one of the arms of said bridge circuit means that is adjacent the first output terminal, said first resistor being a load current sensing resistor in series in the electrical connection of the output line of the first means to the first output terminal, said first resistor passing the load current therethrough and to the first output terminal;

first resistive voltage divider means having one end electrically connected to the first output terminal and one side of said first resistor, having an other end, and having a first tap point;

second resistive voltage divider means having one end electrically connected to the other side of said first resistor that is electrically connected to the output line of the first means, having an other end, and having a second tap point;

a second current sensing resistor in series in the electrical connection of the first input terminal to the one side of the transistor means for sensing input current to the latter, said second resistor having one side electrically connected to the first input terminal and the other end of said first voltage divider means and having its other side electrically connected to the one side of the transistor means and the other end of said second voltage divider means, and second means responsive to a difference voltage developed between the tap points of said voltage divider means that is an indication of the sum of the input and load currents passed by the voltage converter for selectively controlling conduction of the transistor means;

the resistance in at least one arm of said bridge circuit means being variable for adjusting the difference voltage between said first and second tap points to be a prescribed value for a prescribed load current in said first resistor.

5. In a voltage converter responsive to an input voltage at first and second input terminals for producing an output voltage at first and second output terminals across which a load impedance is to be connected and including switching transistor means having one and other sides of a primary conduction path therethrough with the one side thereof electrically connected to the first input terminal, and first means electrically connecting the other side of the transistor means to the second input and second output terminals which are common, the first means being responsive to the primary conduction current for producing the output voltage and a load current on an output line thereof that is electrically connected to the first output terminal, apparatus for producing an indication of load current outputted from the first output terminal comprising:

passive resistive bridge circuit means having a first pair of nodes electrically connected between the first input and first output terminals, said resistive bridge circuit means comprising:

a first current sensing resistor in series in one of the arms of said bridge circuit means that is adjacent the first output terminal, said first resistor being a load current sensing resistor in series in the electrical connection of the output line of the first means to the first output terminal, said first resistor passing the load current therethrough and to the first output terminal;

first resistive voltage divider means having one end electrically connected to the first output terminal and one side of said first resistor, having an other end, and having a first tap point;

second resistive voltage divider means having one end electrically connected to the other side of said first resistor that is electrically connected to the output line of the first means, having an other end, and having a second tap point;

a second current sensing resistor in series in the electrical connection of the first input terminal to the one side of the transistor means for sensing input current to the latter, said second resistor having one side electrically connected to the first input terminal and the other end of said second voltage divider means and having its other side electrically connected to the one side of the transistor means and the other end of said first voltage divider means, and second means responsive to a difference voltage developed between the tap points of said voltage divider means that is an indication of the difference of the input and load currents passed by the voltage converter for selectively controlling conduction of the transistor means;

the resistance in at least one arm of said bridge circuit means being variable for adjusting the difference voltage between said first and second tap points to be a prescribed value for a prescribed load current in said first resistor.

6. Apparatus according to claim 4 or 5 wherein one of said voltage divider means comprises a potentiometer having a moveable contact corresponding to the tap point thereof.

* * * * *